US010320314B2

(12) United States Patent
Fox et al.

(10) Patent No.: US 10,320,314 B2
(45) Date of Patent: Jun. 11, 2019

(54) SYSTEMS AND METHODS FOR REDUCING EFFECTS OF TORSIONAL OSCILLATION FOR ELECTRICAL POWER GENERATION (71) Applicant: The Boeing Company, Chicago, IL (US)

(72) Inventors: Michael T. Fox, St. Charles, MO (US); Kamiar J. Karimi, Kirkland, WA (US); Sheau-Wei J. Fu, Bellevue, WA (US); Eugene V. Solodovnik, Kenmore, WA (US); Paul A. Mezs, Bellevue, WA (US); Jerry E. Farstad, Seattle, WA (US)

(73) Assignee: The Boeing Company, Chicago, IL (US)

( * ) Notice: Subject to any disclaimer, the term of this patent is extended or adjusted under 35 U.S.C. 154(b) by 43 days.

(21) Appl. No.: 15/582,421

(22) Filed: Apr. 28, 2017

(65) Prior Publication Data
US 2018/0316294 A1 Nov. 1, 2018

(51) Int. Cl.
*H02P 9/10* (2006.01)
*H03B 1/04* (2006.01)
*B64D 27/02* (2006.01)
*G01H 1/10* (2006.01)

(52) U.S. Cl.
CPC ............. *H02P 9/105* (2013.01); *B64D 27/02* (2013.01); *H02P 9/10* (2013.01); *H03B 1/04* (2013.01); *G01H 1/10* (2013.01)

(58) Field of Classification Search
CPC ............ H02P 9/105; B64D 27/02; H03B 1/04
See application file for complete search history.

(56) References Cited

U.S. PATENT DOCUMENTS

| 4,080,559 A | 3/1978 | Wright et al. | |
| 4,454,428 A * | 6/1984 | Kimmel | F16F 15/02 290/40 R |
| 7,948,197 B2 * | 5/2011 | Shackelford, IV | E02F 3/48 318/434 |
| 2006/0244425 A1 * | 11/2006 | Sihler | H02P 9/105 322/58 |
| 2009/0009129 A1 * | 1/2009 | Markunas | H02P 9/10 318/702 |

(Continued)

FOREIGN PATENT DOCUMENTS

| EP | 2020744 | 2/2009 |
| EP | 2216896 | 8/2010 |
| WO | WO 2016/034777 | 3/2016 |

*Primary Examiner* — Viet P Nguyen
(74) *Attorney, Agent, or Firm* — Haynes and Boone, LLP (57) ABSTRACT Systems and methods are provided for an aircraft propulsor configured to generate electrical power through a variable frequency generator in response to rotation of a gear train. The aircraft propulsor includes compensation circuitry. The aircraft propulsor further includes exciter circuitry that, when powered by an excitation signal, generates a magnetic field that interacts with a rotating variable frequency generator to generate electrical power. The exciter circuitry may be powered by at least a portion of the power generated by the variable frequency generator. The compensation circuitry may adjust the excitation signal to reduce the effect of torsional oscillation of the gear train and/or the variable frequency generator on the quality of power produced by the variable frequency generator.

16 Claims, 8 Drawing Sheets (56) References Cited

U.S. PATENT DOCUMENTS

| | | | | |
|---|---|---|---|---|
| 2013/0027002 A1* | 1/2013 | Rajashekara | ........... | H02P 9/305 |
| | | | | 322/89 |
| 2014/0375281 A1* | 12/2014 | Hurley | ...................... | H02P 9/14 |
| | | | | 322/19 |
| 2015/0035501 A1* | 2/2015 | Rozman | .................... | H02P 9/02 |
| | | | | 322/29 |
| 2017/0170765 A1* | 6/2017 | Blackwelder | ............. | H02P 9/48 |

* cited by examiner

SYSTEMS AND METHODS FOR REDUCING EFFECTS OF TORSIONAL OSCILLATION FOR ELECTRICAL POWER GENERATION

TECHNICAL FIELD

The disclosure relates generally to aircraft and more specifically to aircraft propulsor electrical power generation.

BACKGROUND

Certain aircraft propulsors may drive a variable-frequency generator (VFG) for providing electrical power to the aircraft. Such a VFG may be coupled to an engine core of the aircraft propulsor through a direct drive gear train, where the direct drive gear train may have a damping factor typically no greater than about 0.02, or 2%. Because of this low damping factor, torsional oscillation may arise within the gear train in the form of limit cycle behavior through oscillation at one or more natural (e.g., resonant) frequencies. Torsional oscillations at such frequencies may be amplified by feedback control, leading to sustained torsional oscillation (STO), also known as sub-synchronous oscillation (SSRO).

Such torsional oscillations may cause a reduction in quality of the electrical power generated by the VFG. In particular, the torsional oscillations may result in the electrical power exhibiting oscillations in voltage and/or current associated with one or more natural frequencies of the gear train. Such oscillations may thus introduce undesirable noise into the electrical power provided to the aircraft which, if left uncorrected, may cause excessive wear and/or damage to aircraft electrical systems.

SUMMARY

Systems and methods are disclosed for attenuating undesirable power generation effects caused by torsional oscillation of a gear train of an aircraft propulsor coupled to a power generator. In one example, an aircraft power generation system may be disclosed. The aircraft power generation system may include a variable frequency generator coupled to a gear train, the gear train having an associated torsional oscillation frequency, exciter circuitry to induce a magnetic field in the variable frequency generator in response to an excitation signal to generate electrical power by the variable frequency generator in response to rotation of the gear train, and compensation circuitry electrically coupled to the exciter circuitry to adjust the excitation signal to filter effects of the torsional oscillation frequency of the gear train in the electrical power provided by the variable frequency generator.

In a further example, a method of operating a power generation system may be disclosed. The method may include rotating a variable frequency generator with a gear train, the gear train having an associated torsional oscillation frequency, inducing a magnetic field in the variable frequency generator with exciter circuitry in response to an excitation signal, generating electrical power with the variable frequency generator and receiving the electrical power with compensation circuitry, adjusting the excitation signal with compensation circuitry, and applying the adjusted excitation signal to the exciter circuitry to filter effects of the torsional oscillation frequency of the gear train in the electrical power provided by the variable frequency generator.

In another example, an aircraft may be disclosed. The aircraft may include a fuselage, a wing, and an aircraft propulsor coupled to the fuselage and/or wing. The aircraft propulsor may include a power unit, a gear train coupled to the power unit, the gear train having an associated torsional oscillation frequency, a variable frequency generator coupled to the gear train, exciter circuitry to induce a magnetic field in the variable frequency generator in response to an excitation signal to generate electrical power by the variable frequency generator in response to rotation of the gear train, and compensation circuitry electrically coupled to the exciter circuitry to adjust the excitation signal to filter effects of the torsional oscillation frequency of the gear train in the electrical power provided by the variable frequency generator.

The scope of the invention is defined by the claims, which are incorporated into this section by reference. A more complete understanding of the disclosure will be afforded to those skilled in the art, as well as a realization of additional advantages thereof, by a consideration of the following detailed description of one or more implementations. Reference will be made to the appended sheets of drawings that will first be described briefly.

BRIEF DESCRIPTION OF THE DRAWINGS

Examples of the disclosure and their advantages are best understood by referring to the detailed description that follows. It should be appreciated that like reference numerals are used to identify like elements illustrated in one or more of the figures.

DETAILED DESCRIPTION

Systems and techniques are provided for reducing effects of torsional oscillation in generated electrical power, for example, by filtering the generated electrical power through application of an adjusted excitation signal provided by compensation circuitry as further discussed herein. In certain examples, the systems and techniques described herein may be incorporated into a generator coupled to a power plant, such as an aircraft propulsor. The aircraft propulsor includes a power unit (e.g., a core engine of an aircraft propulsor and/or other appropriate power system) coupled to a variable frequency generator (VFG). The power unit may be coupled to the VFG via a direct drive gear train. Such a direct drive gear train may have a low damping factor.

The low damping factor may lead to torsional oscillation within the gear train in the form of limit cycle behavior through oscillation at one or more natural (e.g., resonant) frequencies. Such torsional oscillations may cause a reduction in quality of the electrical power generated by the VFG. In particular, the torsional oscillations may result in the electrical power exhibiting oscillations in voltage and/or current associated with the limit cycle behavior of the gear train. For example, the electrical power generated by the VFG may be represented as a composite waveform that includes components at multiple frequencies and at least one of those components (e.g., a component at a certain frequency) may be due to the limit cycle behavior and may be undesirable.

The aircraft propulsor may also include exciter circuitry. An excitation signal may be used to power the exciter circuitry to generate a magnetic field within the VFG. The excitation signal may be based on electrical power generated by the VFG. Thus a feedback loop can exist between the VFG and the exciter circuitry that may cause amplification of the undesirable frequency component of the electrical power generated by the VFG.

To effectively filter the undesirable frequency component, compensation circuitry may be used to generate an adjusted excitation signal. The compensation circuitry may include a voltage regulator, a processor, and a memory. The compensation circuitry may adjust the excitation signal to cause the exciter circuitry to interact with the VFG in a manner that effectively filters the undesirable frequency component. Thus, the compensation circuitry minimizes or reduces the effects of torsional oscillation of the gear train on the power generated by the VFG, leading to an increase in power quality as well as preventing further amplification of the undesirable frequency components. Accordingly, service life of the electrical components may be increased and/or maintenance requirements may be decreased. While this disclosure generally describes effectively implementing a notch filter with the compensation circuitry, other examples of the compensation circuitry may effectively implement other types of filters such as low pass filters, high pass filters, and/or band pass filters.

Generally, the systems and techniques described herein compensate for disturbances to the electrical power generated by the VFG that result from unwanted vibration and/or oscillation (e.g. limit cycle behavior) of the gear train that couples the power unit to the VFG at certain natural frequencies. Examples of such frequencies include frequencies lower than 20 Hertz, between 20 to 40 Hertz, between 40 to 60 Hertz, and greater than 60 Hertz. Specific non-limiting examples of such frequencies include 25 Hertz, 34 Hertz, 37 Hertz, and 60 Hertz. The compensation circuitry may effectively filter a narrow portion of the frequency content of the electrical power produced by the VFG. In certain non-limiting examples, the compensation circuitry may effectively filter less than +/−0.5 Hertz, less than +/−1 Hertz, and/or more than +/−1 Hertz of a frequency range of interest (e.g., 25 Hertz, 34 Hertz, 37 Hertz, and/or 60 Hertz) within the frequency content of the electrical power.

Although the present disclosure references aircraft propulsors (e.g., aircraft power systems that generate thrust and electrical power), the systems and techniques disclosed herein may also be applied to other propulsion systems that generate forward thrust and electrical power (e.g., internal combustion engines, marine power systems, and spacecraft propulsion systems).

Figure 1A:
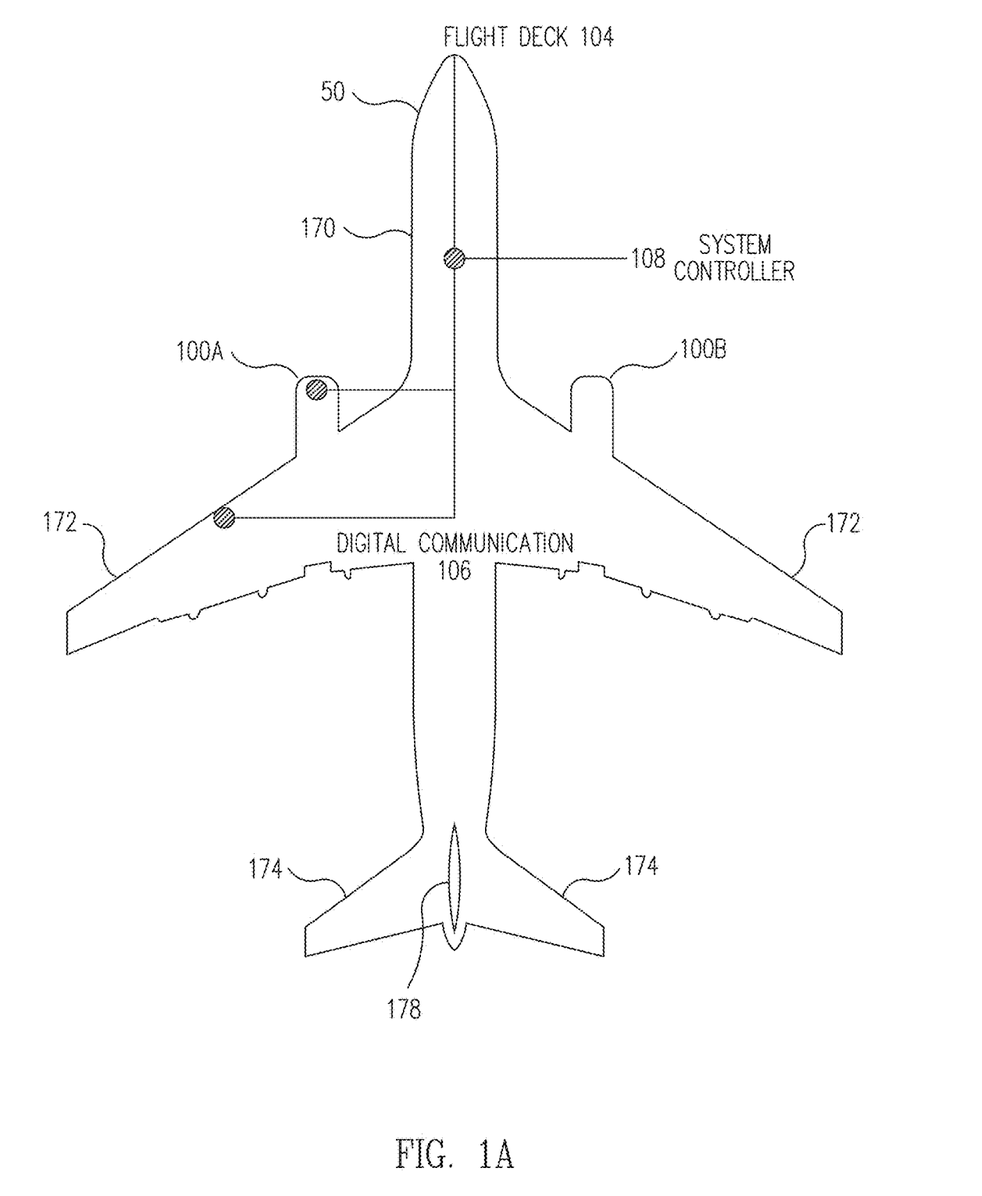
FIG. 1A illustrates a top view of an aircraft in accordance with an embodiment of the disclosure.

FIG. 1A illustrates a top view of an aircraft in accordance with an embodiment of the disclosure. The aircraft 50 of FIG. 1A includes a fuselage 170, wings 172, horizontal stabilizers 174, aircraft propulsors 100A and 100B, and a vertical stabilizer 178. Various controls and sensors are present on the aircraft 50. For example, the aircraft 50 includes a flight deck 104 where a pilot may input instructions for operation of the aircraft 50. The flight deck 104 of the aircraft 50 may include controls that may be manipulated by the pilot(s) of the aircraft 50 to provide instructions for the operation of the aircraft. For example, the flight deck 104 may include a control or controls configured to control operation of the aircraft propulsors 100A and 100B. The flight deck 104 may also include controls for determining a configuration of the horizontal stabilizer or other aerodynamic device of the aircraft 50 as well as the configuration of the vertical stabilizer.

The inputs may be communicated to the system controller 108, which may then provide outputs to various systems of the aircraft 50 (e.g., aircraft propulsors 100A and 100B). The various systems of the aircraft 50 are linked with digital communications 106, which provides signals from one component of the aircraft 50 to one or more other components. The digital communication channel 106 may, for example, be a wired communication circuit or a wireless communications system. The digital communication channel 106 may link the various components to the system controller 108.

The system controller 108 may include, for example, a single-core or multi-core processor or microprocessor, a microcontroller, a logic device, a signal processing device, memory for storing executable instructions (e.g., software, firmware, or other instructions), and/or any elements to perform any of the various operations described herein. In various examples, the system controller 108 and/or its associated operations may be implemented as a single device or multiple devices (e.g., communicatively linked through wired or wireless connections such as the digital communication channel 106) to collectively constitute the system controller 108.

The system controller 108 may include one or more memory components or devices to store data and information. The memory may include volatile and non-volatile memory. Examples of such memories include RAM (Random Access Memory), ROM (Read-Only Memory), EEPROM (Electrically-Erasable Read-Only Memory), flash memory, or other types of memory. In certain examples, the system controller 108 may be adapted to execute instructions stored within the memory to perform various methods and processes described herein, including implementation and execution of control algorithms responsive to sensor and/or operator (e.g., flight crew) inputs.

The aircraft 50 described in FIG. 1A is exemplary and it is appreciated that in other embodiments, the aircraft 50 may include less or additional components (e.g., no horizontal stabilizer, additional stabilizers, additional sensors, and/or additional controllers). Additionally, concepts described herein may be extended to other aircraft such as helicopters, Unmanned Aerial Vehicles, etc.

Figure 1B:
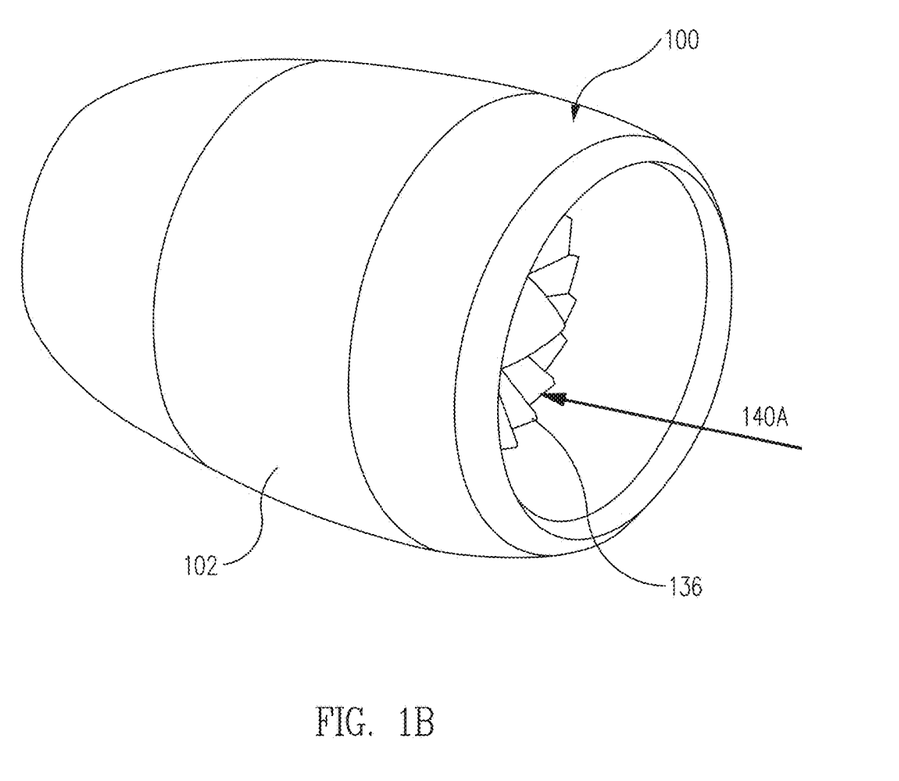
FIG. 1B illustrates a perspective view of an aircraft propulsor in accordance with an embodiment of the disclosure.
Figure 2A:
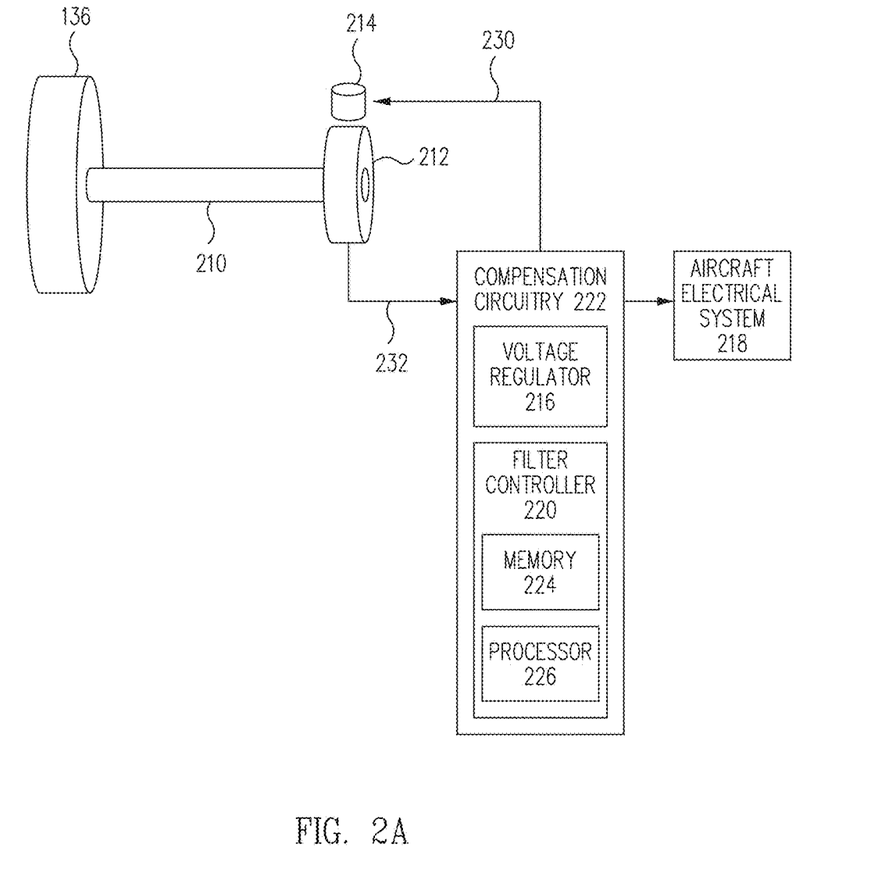
FIG. 2A illustrates a perspective view of an example of an aircraft propulsor electrical power generation system with a torsional oscillation compensation system in accordance with an embodiment of the disclosure.

FIG. 1B illustrates a perspective view of an aircraft propulsor in accordance with an embodiment of the disclosure. Aircraft propulsor 100 (e.g., aircraft propulsors 100A and 100B shown in FIG. 1A) includes a nacelle 102 and a power unit 136. In the example shown in FIG. 1B, the nacelle 102 contains the power unit 136 (in communication with a gear train 210 having a rotating shaft, as shown in FIG. 2A) and other components of the aircraft propulsor 100 used to produce thrust, but other examples of the aircraft propulsor may arrange the fan so that the fan is not contained by the nacelle (e.g., in, for example, a turboprop configuration). The nacelle 102 may also include one or more portions that may be moved and/or removed to allow a technician or other personnel to access internal components of the aircraft propulsor 100 to, for example, insert and/or mount one or more electrical components (e.g., instruments) for monitoring one or more conditions of the aircraft propulsor 100.

The power unit 136 includes one or more fans that intake and/or energize air flowing into the nacelle 102, such as in an airflow direction 140A. Air that flows into the nacelle 102 via airflow direction 140A may flow through various internal flow paths within the nacelle 102 and/or power unit 136. The power unit 136 may include one or more fans and one or more combustion chambers and other components that may be configured to deliver and/or combust fuel provided to the combustion chambers. The power unit 136 may produce thrust to power an aircraft that the aircraft propulsor 100 is coupled to. In certain examples, operation of the power unit 136 may include rotation of at least certain portions of the power unit 136. The power unit 136 may be coupled to and/or may include a VFG. Rotational movement of the power unit 136 may, through a gear train, be used to rotate a VFG of the aircraft propulsor 100.

FIG. 2A illustrates a perspective view of an example of an aircraft propulsor electrical power generation system with a torsional oscillation compensation system in accordance with an embodiment of the disclosure. FIG. 2A may include the power unit 136, a gear train 210, a VFG 212, an exciter circuitry 214, compensation circuitry 222, aircraft electrical systems 218, and a filter controller 220.

The power unit 136 may be any type of power plant such as an engine or power unit of an aircraft propulsor. Accordingly, the power unit 136 may be a power unit of a turbofan, turboprop, turboshaft, propfan, turbojet, Wankel, piston, and/or other type of engine. The power unit 136 is connected to the VFG 212 via the gear train 210. In certain examples, the gear train 210 may be a direct drive gear train, but other examples may include other types of gear trains.

During operation of the aircraft propulsor 100, one or more components (e.g., an output shaft) of the power unit 136 rotates the gear train 210 and the gear train 210 subsequently rotates the VFG 212. When the exciter circuitry 214 receives an excitation signal, the exciter circuitry 214 produces electromagnetic waves that interact with the generator coils of the VFG 212 to produce electrical power 232, which may be used to power aircraft systems. At least a portion of the electrical power 232 generated may also be used to subsequently power the exciter circuitry 214 in the form of excitation signal 230 and thus form a feedback loop that includes at least the VFG 212 and the exciter circuitry 214.

The gear train 210 may be a gear train that has a low damping coefficient. In certain examples, the gear train 210 may be a direct drive gear train. In certain examples, operation of the gear train 210 may result in limit cycle behavior at one or more resonant frequencies.

As the gear train 210 may be directly coupled to the VFG 212, such resonance and/or limit cycle behavior may decrease the quality of electrical power 232 produced by the VFG 212 by generating electrical power that includes certain undesirable components (e.g., undesirable frequency components). The decreased quality of electrical power may be compensated for and/or minimized via the use of compensation circuitry 222. Additionally, the compensation circuitry 222 may minimize and/or prevent amplification of the resonance.

The compensation circuitry 222 may include, at least, a voltage regulator 216 and a filter controller 220. In certain such examples, the compensation circuitry 222 may adjust the excitation signal 230 provided to the exciter circuitry 214 so that the exciter circuitry 214 interacts with the VFG 212 to effectively notch filter the electrical power 232 generated by the VFG 212. The compensation circuitry 222 may adjust the excitation signal 230 by, for example, applying a difference equation to the excitation signal 230 to attenuate certain frequency components of the excitation signal 230. For example, in certain examples, the electrical power 232 generated by the VFG 212 may be represented as a composite waveform that includes components at multiple frequencies. At least one of those components (e.g., a component at a certain frequency) may result from and/or may be amplified by limit cycle behavior of the gear train 210 and may be undesirable. In certain examples of the compensation circuitry 222, a compensation signal in the form of a negative waveform at the frequency of the undesirable component is applied to eliminate or reduce the undesirable component of the electrical power.

Accordingly, the compensation circuitry 222 may be configured to attenuate (e.g., damp by reducing or filtering out) certain frequency components of the excitation signal 230 (e.g., the frequencies that may result from resonance and/or limit cycle behavior within the gear train 210 and/or VFG 212). The frequency and/or frequency range may correspond to and/or include a natural frequency of the gear train 210 and/or VFG 212. Non-limiting examples of such frequencies include 25 Hertz, 34 Hertz, 37 Hertz, and 60 Hertz, but such frequency and/or frequency range can include other frequencies. Such frequencies can be affected by, for example, the design of the gear train 210 and/or VFG 212 such as the number of teeth, weight of the gears, the number of gears, the orientation of the gears, the design of the bearings, the weight, configuration and/or dimensions of components of the gear train 210 and/or the VFG 212, and/or other such factors.

While the present example describes the use of effective notch filtering by compensation circuitry 222, other examples my utilize an actual notch filter that may be configured to filter out certain frequencies of the excitation signal and such an adjusted excitation signal then provided to the compensation circuitry 222.

In an illustrative example, the gear train 210 and/or the VFG 212 may exhibit limit cycle behavior that results in torsional oscillation. The torsional oscillation may be at a frequency of between 1 to 1,000 Hertz (e.g., 25 Hertz, 34 Hertz, 37 Hertz, and/or 60 Hertz). Excitation signal 230 may use and/or be based on the electrical power 232 generated by the VFG 212. The compensation circuitry 222 may configured to adjust and/or attenuate a portion of the excitation signal 230 provided to drive exciter circuitry 214 to compensate for such limit cycle behavior (e.g., by filtering out components of the electrical power at such a frequency before the excitation signal 230 is provided to power the exciter circuitry 214). The compensation circuitry 222 accordingly filters out and/or minimizes components at such frequency (e.g., 34 Hertz) and so reduces the component of the excitation signal 230 that is at 34 Hertz to the exciter circuitry 214. When the exciter circuitry 214 is powered by such a filtered and/or adjusted excitation signal 230, the quality of power generated by the VFG 212 may be improved. Additionally, the magnetic field generated by the exciter circuitry 214 powered by such filtered excitation signal 230 may interact with the VFG 212 in such a way that prevents amplification of the limit cycle within the gear train 210 and/or the VFG 212.

Aircraft electrical systems 218 may include any electrical system of the aircraft, including batteries, instruments, lights, cabin systems, and/or other systems. In certain examples, the aircraft may store at least a portion of the electrical power generated by the VFG 212, but other examples may utilize all power generated by the VFG 212 to power systems of the aircraft. Additionally, the aircraft electrical systems 218 in certain other examples may receive electrical power from the VFG 212 via a circuit separate from the circuit that passes electrical power 232 to through the compensation circuitry 222. Such examples may receive power directly from the VFG 212 and/or receive power from the VFG 212 that has been filtered through other filters.

The filter controller 220 may include, for example, a single-core or multi-core processor or microprocessor 226, a microcontroller, a logic device, a signal processing device, memory 224 for storing executable instructions (e.g., software, firmware, or other instructions), and/or any elements to perform any of the various operations described herein. In various examples, the filter controller 220 and/or its associated operations may be implemented as a single device or multiple devices (e.g., communicatively linked through wired or wireless connections) to collectively constitute the filter controller 220.

The filter controller 220 may include one or more memory components or devices to store data and information that collectively constitute the memory 224. The memory 224 may include volatile and non-volatile memory. Examples of such memories include RAM (Random Access Memory), ROM (Read-Only Memory), EEPROM (Electrically-Erasable Read-Only Memory), flash memory, or other types of memory. In certain examples, the filter controller 220 may be adapted to execute instructions stored within the memory 224 to perform various methods and processes described herein, including implementation and execution of control algorithms responsive to sensor and/or operator (e.g., flight crew) inputs as well as store characteristics associated with the gear train 210 and/or VFG 212.

In certain examples, the compensation circuitry 222 may be configured to filter a pre-determined frequency and/or range of frequencies of the excitation signal 230. Other examples of the compensation circuitry 222 may be configured to determine the frequency of the limit cycle behavior of the gear train 210 and/or the VFG 212. For example, the aircraft may include one or more sensors that may detect torsional oscillation of the gear train 210 and/or the VFG 212. The filter controller 220 may then determine the frequency resulting in the limit cycle behavior and/or a frequency to filter from the electrical power to compensate for the limit cycle behavior. For example, the filter controller 220 may be configured to cause the compensation circuitry 222 to filter certain frequencies of the excitation signal 230 and may be changed during operation to filter different frequencies of the excitation signal 230. The filter controller 220 may then, upon detection of torsional oscillation of the gear train 210 and/or VFG 212 indicative of a limit cycle, cycle through filtering of different frequencies and note the filtered frequencies that eliminate the limit cycle. Filtering at such frequencies by the compensation circuitry 222 may then be maintained.

In certain examples, the filter controller 220 may determine the phase and amplitude of the torsional oscillation of the gear train 210. Once the phase and amplitude are determined, the filter controller 220 may determine adjustment of the excitation signal 230 based on the characteristics of the VFG 212 and the characteristics of the torsional oscillation. The excitation signal 230 may be adjusted so that, when the adjusted excitation signal 230 is applied to the exciter circuitry 214, the magnetic field generated interacts with the VFG 212 so that the VFG 212 produces electrical power 232 that does not include the frequency components resulting from torsional oscillation. In certain such examples, the filter controller 220 may vary the phase of the VFG 212 responsive to the torsional oscillation.

Figure 2B:
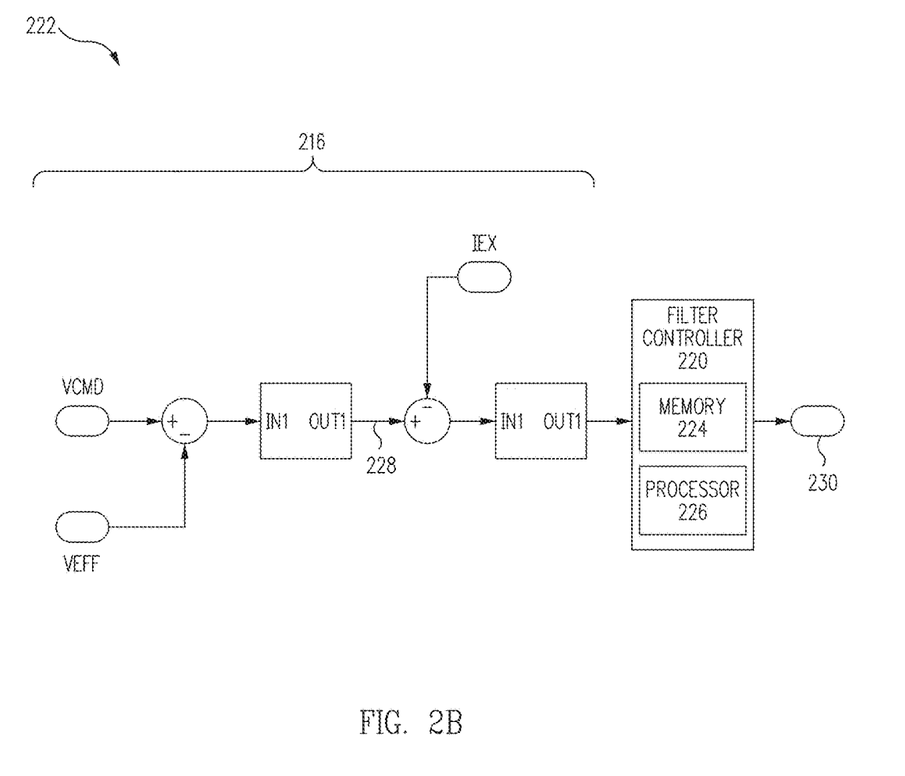
FIG. 2B illustrates a block diagram of compensation circuitry in accordance with an embodiment of the disclosure.

FIG. 2B illustrates a block diagram of compensation circuitry 222 in accordance with an embodiment of the disclosure. In FIG. 2B, the compensation circuitry 222 includes the voltage regulator 216, a two stage voltage regulator, and the filter controller 220.

In the first regulator stage, a command voltage is compared against a measured voltage. The command voltage (VCMD in FIG. 2B) is a target voltage for operation of the aircraft (e.g., 270 volts or any other voltage). The command voltage may be received from, for example, filter controller 220. The measured voltage (VEFF in FIG. 2B, also referred to as the "terminal voltage" of the VFG 212) is differenced against the command voltage and, after differencing, electrical power (e.g., output 228) having an initial regulated voltage (e.g., the result of correcting the measured voltage to the command voltage) is provided to the first regulator stage. In certain examples, the measured voltage may be measured as an output from the VFG 212. In certain such examples, the measured voltage may be a voltage of approximately 270 volts for an alternating current (AC) VFG (e.g., a three-phase AC VFG).

The first regulator stage can correct the measured voltage to the command voltage using any type of regulator. Examples of such a regulator include a regulator configured to regulate one or more AC and/or DC voltages, an electronic voltage regulator such as a resistor in series with one or more diodes, a feedback voltage regulator, an electromechanical regulator, a PWN static voltage regulator, a constant-voltage regulator, an automatic voltage regulator, a DC voltage stabilizer, an active regulator, a voltage slicer, a resolver, and/or another type of voltage regulator. The initial regulated voltage is received by the second regulator stage where it is summed or differenced against the exciter current Iex (e.g., the current provided to the exciter circuitry 214) to provide electrical power having a further regulated output voltage and added current. In certain examples, the exciter current Iex is a disturbance input and the second regulator stage is configured to regulate the effect of the exciter current Iex. The further regulated output voltage and added current is then output to the filter controller 220.

In certain examples, the voltage regulator 216 may also perform a direct-quadrature-zero transformation so that AC voltage from the VFG 212 is transformed to direct current before outputted to the exciter circuitry 214. As such, exciter circuitry 214 may, in such examples, be configured to be powered by direct current. As described, voltage regulator 216 is a single input single output control system. Other examples may include voltage regulators of other types of control systems.

Filter controller 220 may receive the further regulated output voltage and added current from the voltage regulator 216 and attenuate a portion thereof (e.g., a portion of the electrical power corresponding to a component of the electrical power associated with a natural frequency of the gear train 210 and/or VFG 212) by applying a compensation signal. Application of the compensation signal may thus prevent or minimize components of the electrical power at frequencies that may correspond to the natural frequencies of the gear train 210 and/or VFG 212 generated by the VFG 212. Amplification of any limit cycles of the exciter circuitry 214 at such frequencies is thus prevented and/or minimized. While FIG. 2B illustrates the filter controller 220 after the voltage regulator 216, other examples may dispose the filter controller 220 in other locations (e.g., depending on the configuration and requirements of such examples) such as between the regulator stages of the voltage regulator 216, and/or before the voltage regulator 216. The filter controller 220 may then output adjusted excitation signal 230 to, at least, the exciter circuitry 214.

Figure 2C:
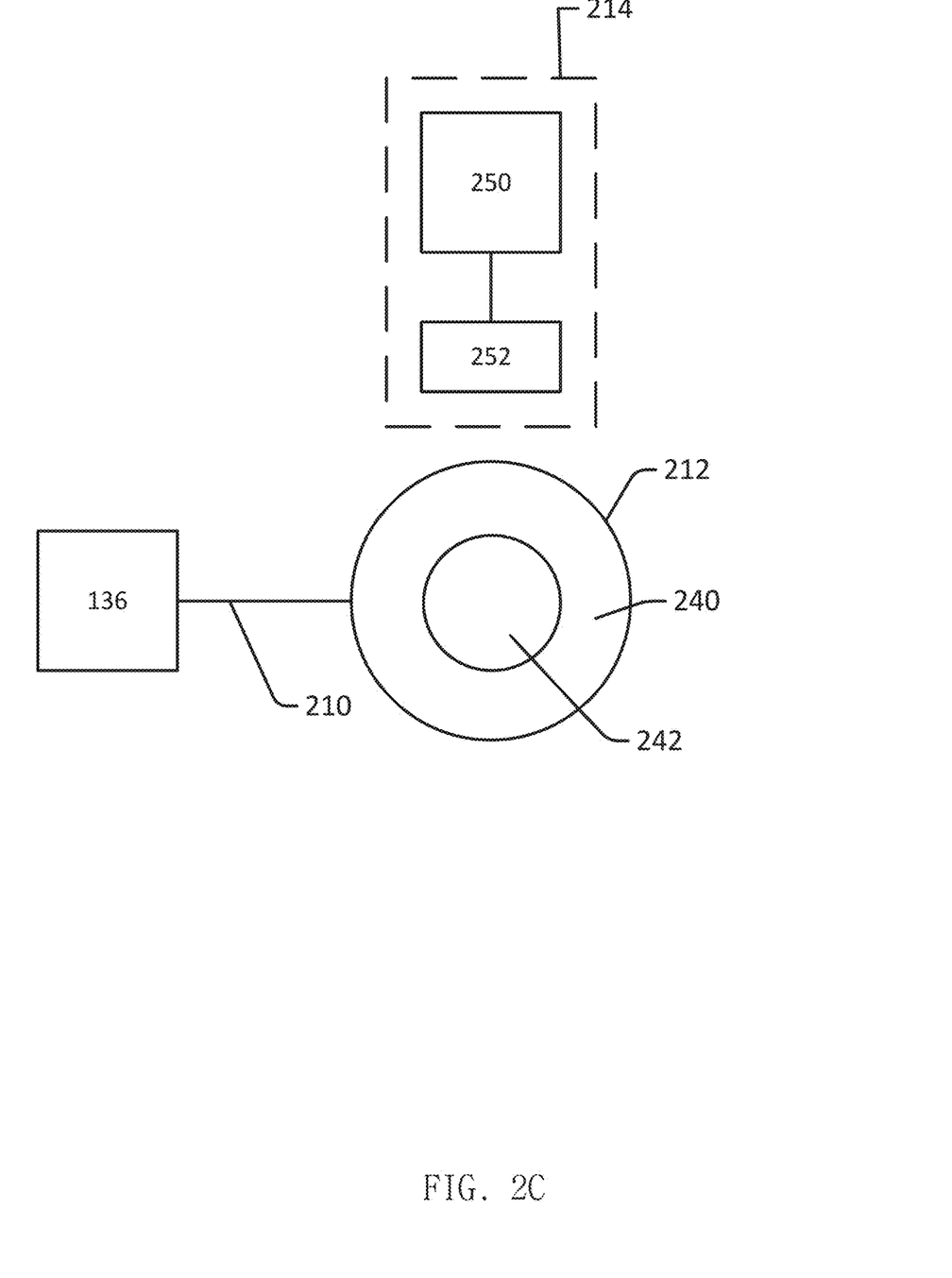
FIG. 2C illustrates a block diagram of an example aircraft propulsor electrical power generation system in accordance with an embodiment of the disclosure.

FIG. 2C illustrates a block diagram of an example aircraft propulsor electrical power generation system in accordance with an embodiment of the disclosure. FIG. 2C includes the power unit 136, gear train 210, VFG 212, and exciter circuitry 214 of FIG. 2A. In FIG. 2C, the exciter circuitry 214 further includes an exciter 250 and a field coil 252. The exciter 250 may receive an excitation signal 230 from compensation circuitry 222 (not shown in FIG. 2C, but shown in FIG. 2A) and may then power the field coil 252. The VFG 212 includes a stator 240 and a rotor 242. The VFG 212 and the exciter circuitry 214 of FIG. 2C are provided for exemplary purposes. Accordingly, other examples may include more, less, or other components and/or may arrange the components in different configurations.

In certain examples, the exciter circuitry 214 is controlled by excitation signal 230 received from the compensation circuitry 222. The compensation circuitry 222 may receive electrical power 232 from the VFG 212. In certain examples, it may be desirable for the exciter circuitry 214 to receive "clean" electrical power at a desired frequency. The electrical power 232 received from the VFG 212 may include certain undesirable components of electrical power (e.g., components at certain frequencies other than the desired frequency), such as components produced due to torsional oscillation of the gear train 210 and/or the VFG 212. For example, the gear train 210 may exhibit limit cycle behavior with a frequency of 34 Hz and, thus, the electrical power 232 produced by the VFG 212 may include an undesirable component at a frequency of 34 Hz. The compensation circuitry 222 may then filter out at least a component of the electrical power 232 at the frequency of 34 Hz to "clean up" the electrical power before providing an adjusted excitation signal 230 based on the electrical power 232 to the exciter circuitry 214. As the exciter circuitry 214 interacts with the VFG 212 to produce power, powering the exciter circuitry 214 with the adjusted excitation signal 232 may then result in the higher quality of power produced by the VFG 212.

Figure 3:
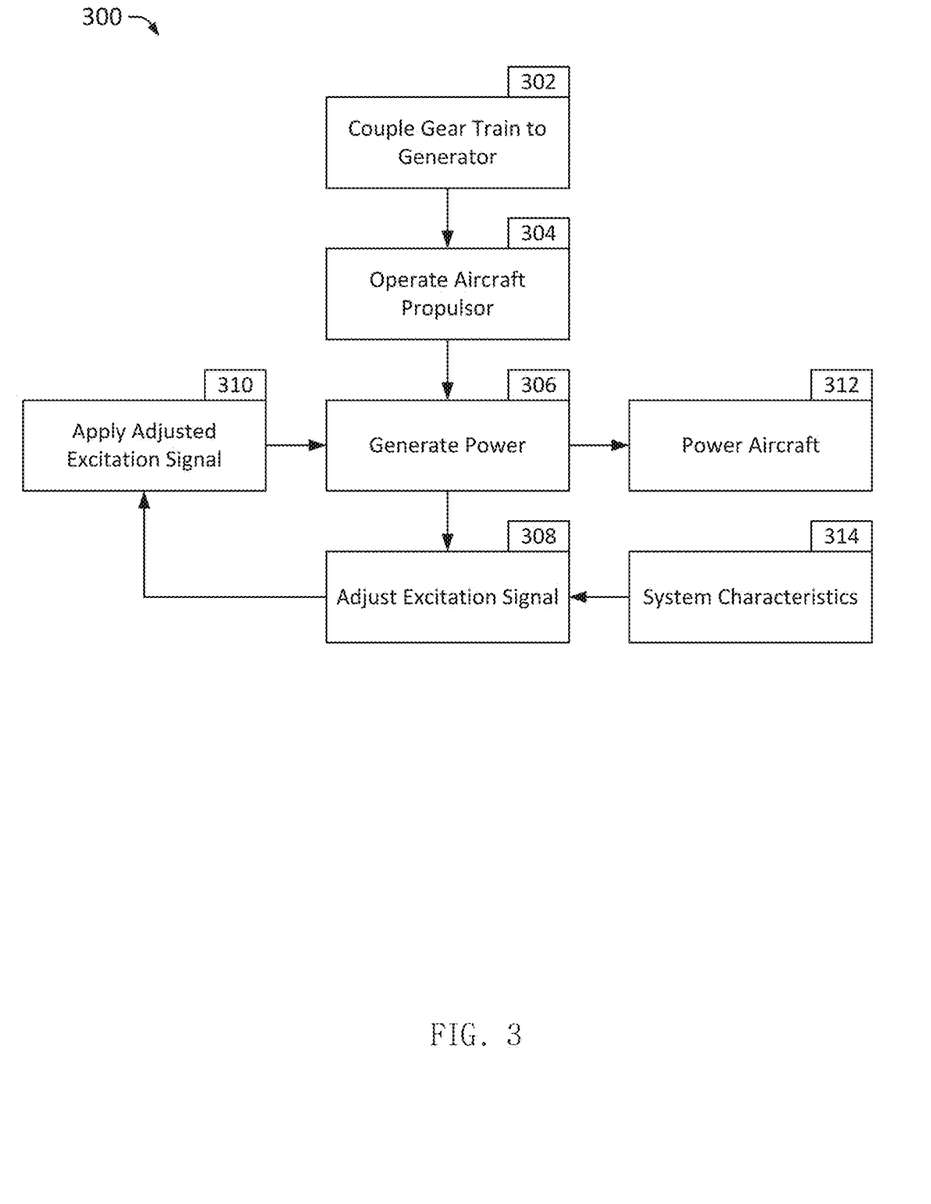
FIG. 3 is a flowchart detailing operation of an aircraft propulsor electrical power generation system with a torsional oscillation compensation system in accordance with an embodiment of the disclosure.

FIG. 3 is a flowchart detailing a method 300 for reducing effects of torsional oscillation for electrical power generation in accordance with an embodiment of the disclosure. The method 300 described in FIG. 3 may be performed by a power plant such as the aircraft propulsor 100 that includes the voltage regulator 216.

In block 302, the gear train 210 is coupled to the VFG 212. In certain examples, the gear train 210 can be a direct drive gear train. Block 302 may be performed during, for example, manufacture of the aircraft propulsor 100, manufacture of the aircraft 50, maintenance of the aircraft propulsor 100, or another time period.

In block 304, the aircraft propulsor 100 is operated. For example, the power unit 136 of the aircraft propulsor 100 may be operated to turn one or more output shafts coupled to the gear train 210. The gear train 210 then turns the VFG 212.

In block 306, electrical power 232 is generated by turning the VFG 212 and powering the exciter circuitry 214. Powering the exciter circuitry 214 when the VFG 212 is turning generates a magnetic field. Coils of the rotating VFG 212 interact with the magnetic field generated by the exciter circuitry 214 to produce electrical power. A portion of the power produced by the VFG 212 is then provided to power aircraft electrical systems in block 312, while another portion of the power is provided to the compensation circuitry 222. The compensation circuitry 222 may then generate and/or adjust an excitation signal 230 that powers the exciter circuitry 214, as detailed in blocks 308 and 310. The excitation signal 230 may be based on the electrical power 232 generated by the VFG 212.

In block 308, the compensation circuitry 222 generates and/or adjusts the excitation signal 230. The compensation circuitry 222 may adjust the excitation signal 230 by providing a compensation signal (e.g., an inverse waveform) to reduce and/or cancel out the undesirable component of the electrical power received. Other examples may include a physical notch filter. The adjusted excitation signal 230 may be applied to the exciter circuitry 214 in block 310.

The frequencies to be filtered may be determined in block 314. In certain examples, the characteristics of the gear train 210 and/or the VFG 212 may be modeled and/or determined in the design and/or testing of the aircraft propulsor 100. For example, while the gear train 210 and/or the VFG 212 may be configured to operate at a variety of different rotational speeds, torsional oscillation of the gear train 210 and/or the VFG 212 may occur at some or all such rotational speeds. The torsional oscillation may be an oscillation at a set frequency (e.g., 25 Hz, 34 Hz, 37 Hz, or 68 Hz) and the frequency of such oscillation may be independent of rotational speed of the gear train 210 and/or the VFG 212. Modeling and/or testing of the aircraft propulsor 100 may identify such oscillation frequencies.

In other examples, such oscillation frequencies may be identified during bench testing and/or operation of the aircraft propulsor 100. For example, the compensation circuitry 222 may include a bandpass filter. During start-up and/or operation of the aircraft propulsor 100, the bandpass filter may selectively pass certain frequencies or frequency ranges of the excitation signal 230 and the filter controller 220 may detect limit cycle behavior resulting from passing such frequencies or frequency ranges. As limit cycle behavior may require time to manifest, each such frequencies or frequency range may be passed for a period of time.

If no limit cycle behavior manifests during the period of time, then such frequency or frequency range may be determined to not result in limit cycle behavior and, accordingly, not required to be notch filtered. The bandpass filter may then allow another frequency and/or frequency range to pass to detect for limit cycle behavior.

If limit cycle behavior is detected, such a frequency and/or frequency range may be determined to result in limit cycle behavior and the compensation circuitry 222 may then be configured to filter and/or attenuate (e.g., by a notch filter) the frequency and/or frequency range where the limit cycle behavior was detected. The bandpass filter may then allow another frequency and/or frequency range to pass.

In an illustrative example of an implementation of the method 300 described in FIG. 3, the gear train 210 of an aircraft propulsor 100 may be coupled to the VFG 212 in block 302. In block 304, after the aircraft 50 containing the aircraft propulsor 100 has been fully assembled, the aircraft 50 may be operated in block 304 by powering up the aircraft propulsor 100.

As the core engine 136 of the aircraft propulsor 100 rotates the gear train 210, which in turn rotates the VFG 212, the exciter circuitry 214 is powered and generates a magnetic field that may interact with the coils of the VFG 212 to generate electrical power in block 304. The electrical system of the aircraft 50 may be powered by the generated electrical power 232. The electrical power 232 generated by the VFG 212 may also be used to power the exciter circuitry 214.

Additionally, the gear train 210 may manifest limit cycle behavior due to poor damping of the gear train 210. The limit cycle behavior may include torsional oscillation of the gear train 210. The torsional oscillation may be oscillation at certain specific frequencies and such frequencies of oscillation may be independent of rotational speed of the gear train 210. As such, though the rotational speed of the gear train 210 may speed up or slow down, the gear train 210 may continue to oscillate at such frequencies. Such torsional oscillation may manifest in the electrical power 232 generated as an undesirable component of the electrical power. The undesirable component of electrical power 232 may be a component of the electrical power 232 at a certain frequency (e.g., 34 Hz). In certain examples, the undesirable component of electrical power 232 may manifest as peaking of certain components of the electrical power 232 (e.g., components at certain frequencies). Accordingly, the limit cycle behavior may lead to a decrease in the quality of power generated by the VFG 212.

Characteristics of such limit cycle behavior may be identified during design of the aircraft propulsor 100, previous to manufacture and operation of the aircraft propulsor 100, in block 314. Accordingly, during design of the aircraft propulsor 100, the system characteristics of the aircraft propulsor 100 may be modeled during design of the aircraft propulsor 100 to determine the frequency of the undesirable component of electrical power 232 due to torsional oscillation of the gear train 210. As the excitation signal 230 is based on the electrical power 232, the compensation circuitry 222 is then configured to generate a compensation signal to adjust the excitation signal 230 to attenuate the undesirable components of electrical power.

The adjusted excitation signal 230 is generated in block 308. Such an adjusted excitation signal 230 may be applied to the exciter circuitry 214 in block 310. As such, the excitation signal 230 received by the exciter circuitry 214 may be an excitation signal 230 with the undesirable components filtered out. As the exciter circuitry 214 is powered by such an adjusted excitation signal 230, the quality of electrical power 232 generated by the VFG 212 may be improved. Thus, the quality of electrical power 232 generated in block 306 may be improved.

Figure 4:
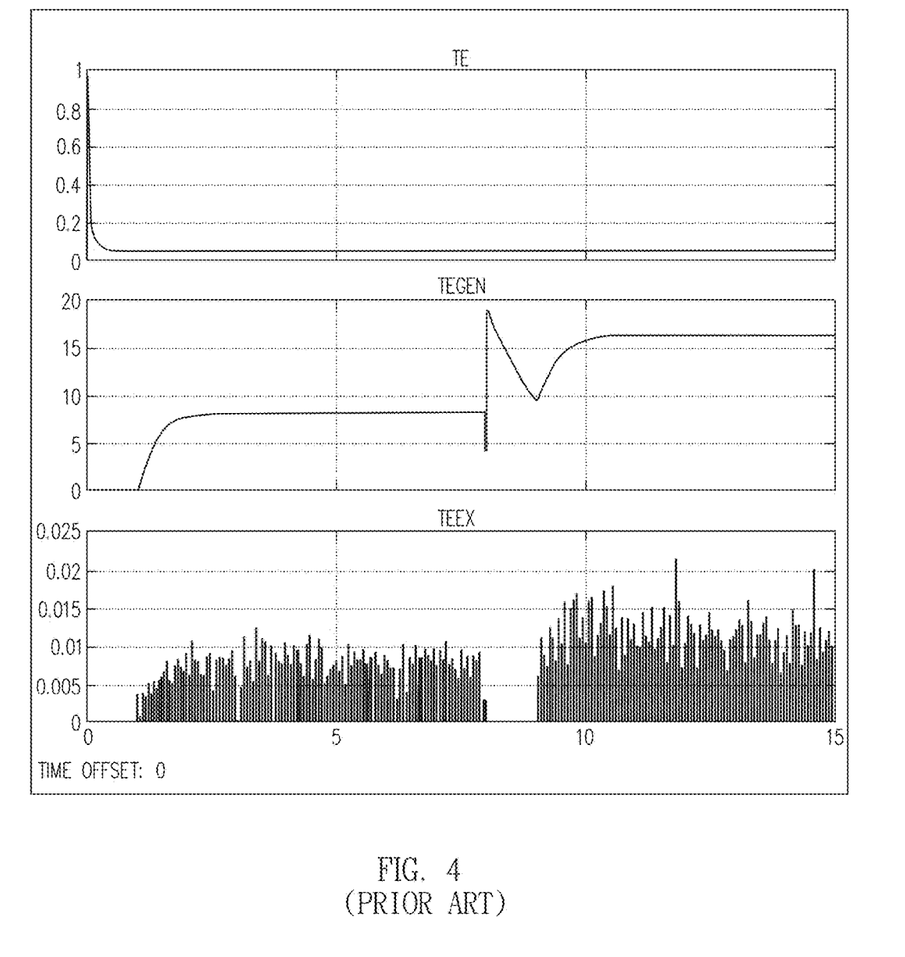
FIG. 4 illustrates modeled behavior of an aircraft propulsor electrical power generation system without a torsional oscillation compensation system.
Figure 5:
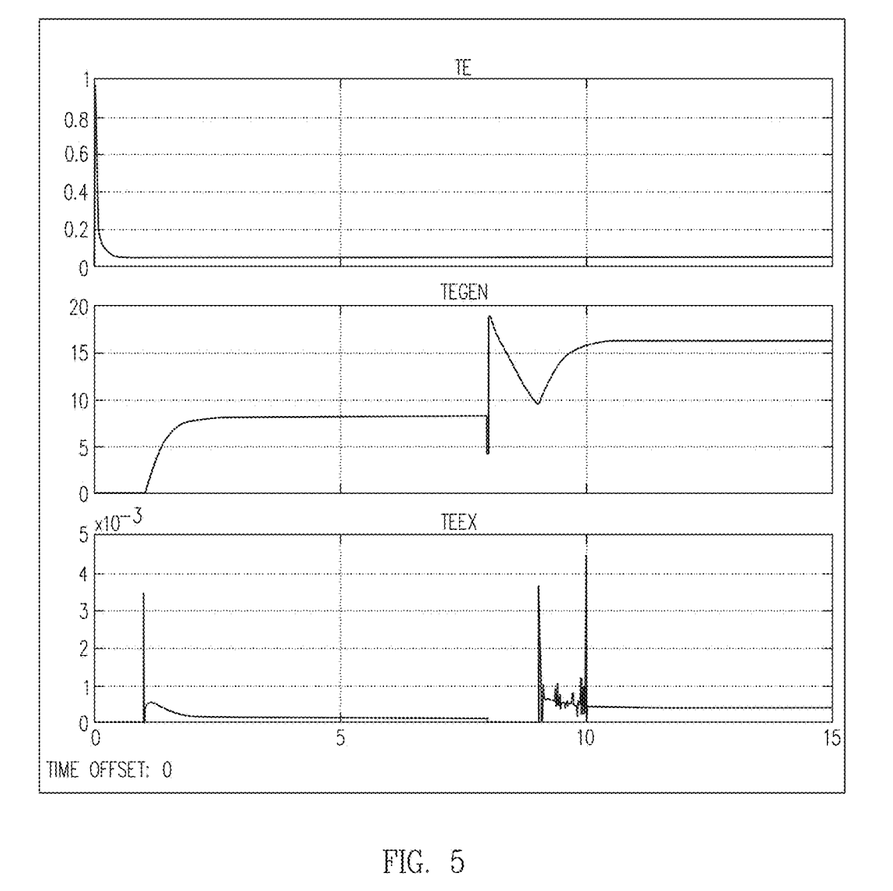
FIG. 5 illustrates modeled behavior of an aircraft propulsor with a torsional oscillation compensation system in accordance with an embodiment of the disclosure.

FIG. 4 illustrates modeled behavior of an aircraft propulsor electrical power generation system without a torsional oscillation compensation system. FIG. 5 illustrates modeled behavior of an aircraft propulsor with a torsional oscillation compensation system in accordance with the disclosure. FIGS. 4 and 5 illustrate a model of operation of an aircraft propulsor lacking a notch filter versus a model of operation of an aircraft propulsor with a notch filter.

In FIGS. 4 and 5, the top graph illustrates TE, which is a torque disturbance on the gear train 210 from the power unit 136 as shown in FIG. 2A. In this non-limiting example, TE is an impulse that is represented as a normalized signal starting at full strength and tapering down to about 5% (0.05) of full strength. The middle graph illustrates TEGEN, which is torque from the VFG 212 of FIG. 2A. The bottom graph illustrates TEEX, which is exciter torque from the exciter circuitry 214 of FIG. 2A. The x-axes of all such graphs are time units in seconds.

FIG. 4 illustrates the response of an aircraft propulsor lacking the torsional oscillation compensation system. As illustrated in the bottom graph of FIG. 4, there is exciter torque resonance due to the limit cycle behavior of the gear train 210 of the aircraft propulsor due to the interaction between the magnetic field generated by the exciter circuitry 214 and the resonating gear train 210 affecting rotation of the VFG 212. Between approximately 7 and 8 seconds, the amount of electrical power produced by the VFG 212 is changed, leading to a gap in electrical power produced that results in a lack of resonance of the exciter torque, as shown in the bottom graph. Afterwards, when electrical power is again produced by the VFG 212, the resonance of the exciter torque returns.

The model in FIG. 5 is different from the model in FIG. 4 in that compensation circuitry 222 that effectively notch filters the excitation signal 230 is present in the model to adjust electricity generated by the VFG 212. As shown in FIG. 5, the bottom graph (TEEX) illustrates that the resonance present in FIG. 4 is decreased due to the compensation circuitry 222 despite the VFG 212 generating the same amount of power at the same points in time as that in FIG. 4.

As described herein and shown in FIGS. 4 and 5, the torsional oscillation compensation system utilizes compensation circuitry 222 to effectively filter (e.g., notch filter) components of electrical power generated by the VFG and provided as an excitation signal. Adjusting the excitation signal in such a manner prevents and/or reduces feedback induced amplification of torsional oscillation of the gear train and/or the VFG and thus increases service life of the electrical components, decreases maintenance requirements, and/or increases the quality of the power generated by the VFG.

Examples described above illustrate but do not limit the invention. It should also be understood that numerous modifications and variations are possible in accordance with the principles of the present invention. Accordingly, the scope of the invention is defined only by the following claims.

What is claimed is:

1. An aircraft propulsor comprising:
a variable frequency generator coupled to a gear train, wherein the gear train has an associated torsional oscillation frequency;
exciter circuitry to induce a magnetic field in the variable frequency generator in response to an excitation signal to generate electrical power by the variable frequency generator in response to rotation of the gear train; and
compensation circuitry electrically coupled to the exciter circuitry, wherein the compensation circuitry comprises a controller that adjusts, independent of movement of the variable frequency generator and based on one or more characteristics of the gear train, the excitation signal in accordance with a predetermined frequency range to filter effects of the torsional oscillation frequency of the gear train in the electrical power provided by the variable frequency generator; wherein the one or more characteristics are stored in a memory of the compensation circuitry, and wherein at least one of the characteristics is associated with the torsional oscillation frequency.

2. The aircraft propulsor of claim 1, wherein an adjusted magnetic field induced in the variable frequency generator in response to the adjusted excitation signal performs notch filtering on the electrical power generated in response to the rotation of the gear train.

3. The aircraft propulsor of claim 1, wherein the effects of the torsional oscillation frequency comprise sub-synchronous oscillations of the gear train.

4. The aircraft propulsor of claim 1, wherein the controller is configured to perform a bench testing operation to determine the one or more characteristics by operating the exciter circuitry to selectively filter the electrical power over a plurality of possible torsional oscillation frequencies to identify the torsional oscillation frequency associated with the gear train.

5. The aircraft propulsor of claim 1, wherein the associated torsional oscillation frequency comprises a natural frequency of the gear train.

6. The aircraft propulsor of claim 1, wherein the exciter circuitry comprises an exciter electrically coupled to a field coil to provide current to the field coil in response to the excitation signal to induce the magnetic field.

7. The aircraft propulsor of claim 1, further comprising:
a power unit; and
the gear train coupling the power unit to the variable frequency generator, wherein the gear train is a direct drive gear train.

8. A method of operating a power unit of an aircraft propulsor, the method comprising:
rotating a variable frequency generator with a gear train, wherein the gear train has an associated torsional oscillation frequency;
inducing a magnetic field in the variable frequency generator with exciter circuitry in response to an excitation signal;
generating electrical power with the variable frequency generator and receiving the electrical power with compensation circuitry;
adjusting, independent of movement of the variable frequency generator and based on one or more stored characteristics of the gear train, the excitation signal with compensation circuitry in accordance with a predetermined frequency range, wherein at least one of the characteristics is associated with the torsional oscillation frequency; and
applying the adjusted excitation signal to the exciter circuitry to filter effects of the torsional oscillation frequency of the gear train in the electrical power provided by the variable frequency generator.

9. The method of claim 8, wherein an adjusted magnetic field induced in the variable frequency generator in response to the adjusted excitation signal performs notch filtering on the electrical power generated in response to the rotation of the gear train.

10. The method of claim 8, wherein the effects of the torsional oscillation frequency comprise sub-synchronous oscillations of the gear train.

11. The method of claim 8, further comprising performing a bench testing operation to determine the one or more characteristics by operating the exciter circuitry to selectively filter the electrical power over a plurality of possible torsional oscillation frequencies to identify the torsional oscillation frequency associated with the gear train.

12. The method of claim 8, wherein the associated torsional oscillation frequency comprises a natural frequency of the gear train.

13. The method of claim 8, wherein the exciter circuitry comprises an exciter electrically coupled to a field coil to provide current to the field coil in response to the excitation signal to induce the magnetic field.

14. The method of claim 8, wherein a power unit rotates the gear train to rotate the variable frequency generator, and wherein the gear train is a direct drive gear train.

15. An aircraft comprising:
a fuselage;
a wing; and
an aircraft propulsor coupled to the fuselage and/or the wing, the aircraft propulsor comprising:
a power unit,
a gear train coupled to the power unit, wherein the gear train has an associated torsional oscillation frequency,
a variable frequency generator coupled to the gear train,
exciter circuitry to induce a magnetic field in the variable frequency generator in response to an excitation signal to generate electrical power by the variable frequency generator in response to rotation of the gear train, and
compensation circuitry electrically coupled to the exciter circuitry, wherein the compensation circuitry comprises a controller that adjusts, independent of movement of the variable frequency generator and based on one or more characteristics of the gear train, the excitation signal in accordance with a predetermined frequency range to filter effects of the torsional oscillation frequency of the gear train in the electrical power provided by the variable frequency generator, wherein the one or more characteristics are stored in a memory of the compensation circuitry, and wherein at least one of the characteristics is associated with the torsional oscillation frequency.

16. The aircraft of claim 15, wherein an adjusted magnetic field induced in the variable frequency generator in response to the adjusted excitation signal performs notch filtering on the electrical power generated in response to the rotation of the gear train.

* * * * *